(12) United States Patent
Chou et al.

(10) Patent No.: US 11,281,091 B2
(45) Date of Patent: Mar. 22, 2022

(54) PHOTOMASK

(71) Applicant: TAIWAN SEMICONDUCTOR MANUFACTURING CO., LTD., Hsinchu (TW)

(72) Inventors: You-Hua Chou, Hsinchu (TW); Kuo-Sheng Chuang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/694,348

(22) Filed: Nov. 25, 2019

(65) Prior Publication Data

US 2020/0089099 A1    Mar. 19, 2020

Related U.S. Application Data

(62) Division of application No. 15/471,151, filed on Mar. 28, 2017, now Pat. No. 10,488,749.

(51) Int. Cl.
| | |
|---|---|
| *G03F 1/20* | (2012.01) |
| *G03F 1/22* | (2012.01) |
| *G03F 1/60* | (2012.01) |
| *G03F 1/80* | (2012.01) |
| *G03F 1/38* | (2012.01) |

(Continued)

(52) U.S. Cl.
CPC ............... *G03F 1/38* (2013.01); *G03F 1/20* (2013.01); *G03F 1/22* (2013.01); *G03F 1/54* (2013.01); *G03F 1/60* (2013.01); *G03F 1/80* (2013.01); *G03F 1/86* (2013.01)

(58) Field of Classification Search
CPC ..... G03F 1/38; G03F 1/20; G03F 1/22; G03F 1/54; G03F 1/60; G03F 1/80; G03F 1/86
See application file for complete search history.

(56) References Cited

U.S. PATENT DOCUMENTS 4,513,203 A * 4/1985 Bohlen ................. B82Y 10/00
250/491.1
5,214,291 A * 5/1993 Hirai ..................... B82Y 10/00
250/398

(Continued)

FOREIGN PATENT DOCUMENTS

| EP | 222739 | * 11/1986 |
| JP | 08-130175 | * 5/1986 |

(Continued)

OTHER PUBLICATIONS

Machine translation of JP 04-196209 (1992).*

(Continued)

*Primary Examiner* — Martin J Angebranndt
(74) *Attorney, Agent, or Firm* — Birch, Stewart, Kolasch & Birch, LLP (57) ABSTRACT

A photomask includes a patterned photomask plate and a supporting member. The patterned photomask plate has a pattern region and a peripheral region surrounding the pattern region. The patterned photomask plate includes a plurality of openings in the pattern region. The supporting member directly abuts the patterned photomask plate and is in a peripheral region of the patterned photomask plate. The supporting member is formed from a different material than the patterned photomask plate.

20 Claims, 11 Drawing Sheets

(51) Int. Cl.
*G03F 1/54* (2012.01)
*G03F 1/86* (2012.01)

(56) References Cited

U.S. PATENT DOCUMENTS

| | | | | |
|---|---|---|---|---|
| 5,849,437 A * | 12/1998 | Yamazaki | ............... | B82Y 10/00 430/5 |
| 5,858,576 A * | 1/1999 | Takashi | ............... | G03F 1/20 378/34 |
| 6,355,383 B1 * | 3/2002 | Yamashita | ............... | B82Y 10/00 250/492.2 |
| 6,555,297 B1 | 4/2003 | Lercel | | |
| 2001/0044055 A1 * | 11/2001 | Yamada | ............... | G03F 1/20 430/5 |
| 2002/0001964 A1 * | 1/2002 | Choi | ............... | G03F 1/20 438/719 |
| 2002/0012852 A1 | 1/2002 | Kim | | |
| 2002/0167666 A1 * | 11/2002 | Stach | ............... | G03F 1/62 356/432 |
| 2002/0192573 A1 * | 12/2002 | Sasago | ............... | G03F 1/22 430/5 |
| 2003/0137024 A1 * | 7/2003 | Moriya | ............... | B82Y 10/00 430/5 |
| 2008/0302391 A1 * | 12/2008 | Sone | ............... | B08B 3/08 134/21 |
| 2011/0151358 A1 * | 6/2011 | Kamo | ............... | B82Y 40/00 430/5 |
| 2016/0358783 A1 | 12/2016 | Uhlig | | |

FOREIGN PATENT DOCUMENTS

| | | | |
|---|---|---|---|
| JP | 62-248590 A | | 10/1987 |
| JP | 62-252030 | * | 11/1987 |
| JP | 01-107988 A | | 4/1989 |
| JP | 04-155730 | * | 5/1992 |
| JP | 04-196209 | * | 7/1992 |
| JP | 05-208385 A | | 8/1993 |
| JP | 07-323387 A | | 12/1995 |
| JP | 08-130176 A | | 5/1996 |
| JP | 10-097055 A | | 4/1998 |
| JP | 11-233417 A | | 8/1999 |
| JP | 2002-008965 | * | 1/2002 |
| JP | 2002-011589 | | 1/2002 |
| JP | 2002-289508 A | | 10/2002 |
| JP | 2002-313564 | * | 10/2002 |
| JP | 2004-319909 | * | 11/2004 |
| JP | 2005-150591 A | | 6/2005 |
| JP | 2005-286276 | * | 10/2005 |
| JP | 2005-286276 A | | 10/2005 |
| JP | 2006-100336 | * | 4/2006 |
| JP | 2007-088107 A | | 4/2007 |
| SU | 1542835 | * | 2/1990 |

OTHER PUBLICATIONS

"Mask for excimer laser ablation and methods of producing same" IBM Tech. Discl. Bull., vol. 33(1A) pp. 388-390 (Jun. 1990).*
Machine translation of JP 62-252030 ( 1987).*
Machine translation of EP 222738 (1986 ).*
Machine translation of JP 2005-286276 (2005).*
Machine translation of JP 04-155730 (1992 ).*

* cited by examiner

PHOTOMASK

CROSS-REFERENCE TO RELATED APPLICATION

This application is a divisional of U.S. patent application Ser. No. 15/471,151, filed Mar. 28, 2017, now U.S. Pat. No. 10,488,749, issued Nov. 26, 2019, which is herein incorporated by reference in its entirety.

BACKGROUND

The semiconductor industry has experienced rapid growth in the past several decades. Technological advances in semiconductor materials and designs have produced increasingly smaller and more complex circuits. These semiconductor materials and designs become possible with the development of technologies related to processing and fabricating.

For fabrication of a semiconductor device, lithography processes are heavily relied, in which light of a particular wavelength is utilized to transfer a desired pattern onto a semiconductor wafer. One lithography process developed to achieve the increased fabrication requirements is an extreme ultraviolet (eUV) lithography process. For an eUV lithography operation, in order to transfer the desired pattern onto the semiconductor wafer, an eUV photomask is arranged to allow and prevent light corresponding to the desired pattern onto the semiconductor wafer. However, for a conventional reflective type eUV photomask, a significant optical loss occurs during a lithography operation due to reflection and refraction losses at respective layers of such reflective type eUV photomask. Although a conventional transmissive type eUV photomask may be alternatively applied, such transmissive type eUV photomask also arises a certain optical loss, because the substrate would absorb a percentage of light (especially components of low wavelengths, such as 13.5 nm, 22 nm, etc.) which is propagated toward a semiconductor substrate for a lithographic patterning operation. Furthermore, when the conventional eUV photomask is utilized under a high power environment for an eUV lithography operation, some components of the conventional eUV photomask (e.g. eUV reflective layers) are likely to be peeled or distorted.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first," "second," "third," etc., may be used in the claims to describe various elements and/or operations, these elements and/or operations should not be limited by their terms, and these elements and/or operations correspondingly described in the embodiments are presented by different reference numbers. These terms are used to distinguish one element and/or operation from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "upper," "lower," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Embodiments of the present disclosure are directed to a photomask and methods of forming the same, and more particularly to a transmissive type photomask with high optical efficiency for a lithography operation, such as an ultraviolet (UV) lithography operation, an extreme UV (eUV) lithography operation, a deep UV (DUV) lithography operation, and the like. In addition, the photomask in accordance with the embodiments of the present disclosure has a simplified structure, and therefore has at least the advantages of lower fabricating cost, lower particle issue and easier for inspection. Moreover, the photomask in accordance with the embodiments of the present disclosure can be used for an eUV lithography operation under a high power environment without any photomask peeling or distortion issue.

Figure 1:
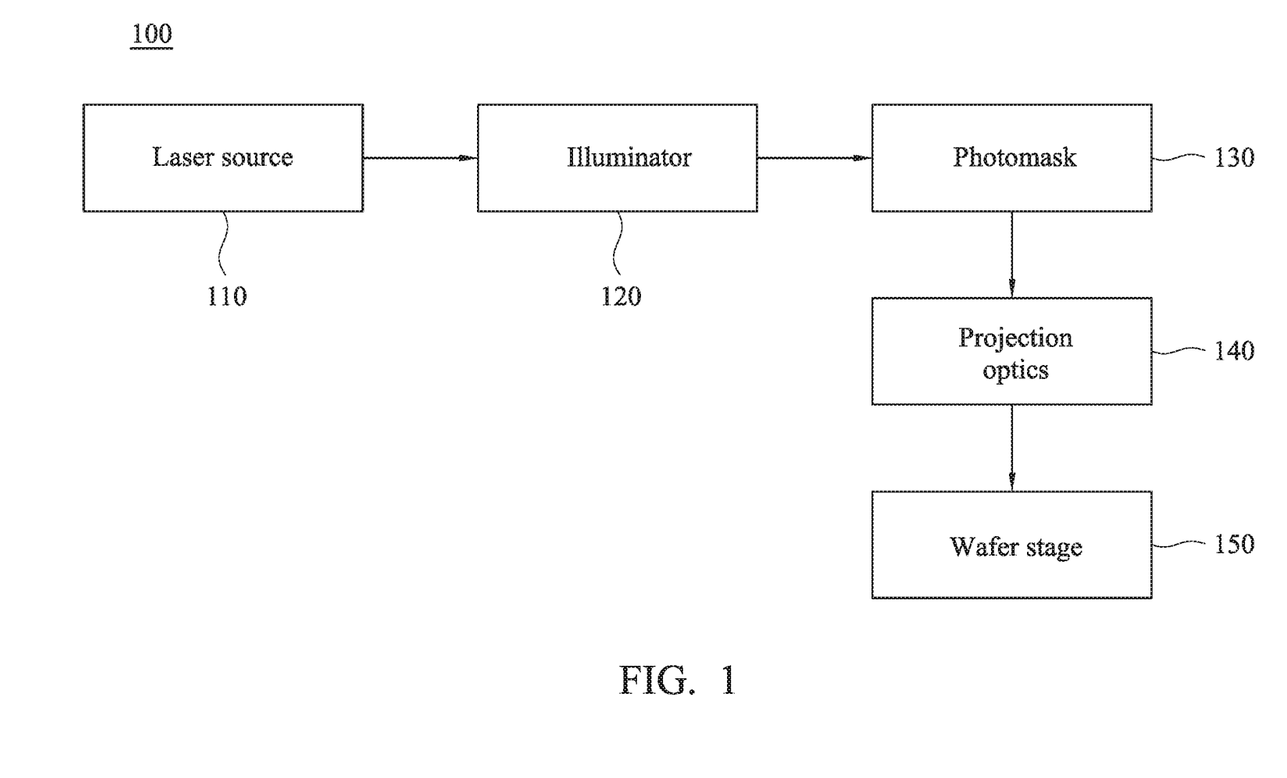
FIG. 1 is a schematic block diagram of a lithography device in accordance with some embodiments of the present disclosure.

Referring to FIG. 1, FIG. 1 is an exemplarily block diagram of a lithography device 100 in accordance with some embodiments of the present disclosure. The lithography device 100 includes a light source 110, an illuminator 120, a photomask 130, projection optics 140 and a wafer stage 150. The light source 110 may be any suitable light source, such as an UV light source, a DUV light source, an EUV light source, an X-ray source, and another suitable light source.

The illuminator 120 include optical components, such as a single mirror and a mirror system having multiple mirrors, in order to direct light from the light source 110 toward the photomask 130. The illuminator 120 may be configured to shape the light passing therethrough in accordance with a particular shape, such as a dipole shape, a quadrupole shape, an annular shape, a single beam shape, a multi-beam shape, combination thereof, and/or the like, and may be operated to configure its optical components to provide a desired illumination pattern to the wafer stage 150. In some embodiments, the illuminator 120 may further include a zone plate, in order to further improve focus of the light emitted from the light source 110.

The photomask 130 is a patterned transmissive photomask which selectively allows a portion of the light from the illuminator 120 to travel toward the projection optics 140 and absorbs the other portion of the light (i.e. blocks the other portion of the light from traveling toward the projection optics 140). In some embodiments, the lithography device 100 may further include a reticle stage (not shown) configurable to secure the photomask 130. In some embodiments, the lithography device 100 is an eUV lithography device operated in a high-vacuum environment, and the reticle stage may further include an electrostatic chuck (e-chuck) for securing the photomask 130.

The projection optics 140 are configured to propagate the patterned light (i.e. patterned by the photomask 130) toward the wafer stage 150. The projection optics 140 may include refractive lenses, reflective mirrors, condensers, combinations thereof, or other suitable optical components, and may be operated to tune the reflective mirrors of the illuminator 120 for phase modulation.

The wafer stage 150 is configured to secure a semiconductor substrate which is to be patterned under a lithographic operation of the lithography device 100. The semiconductor substrate may be a semiconductor wafer, such as a silicon wafer, germanium wafer, silicon-germanium wafer, III-V wafer, or another suitable semiconductor wafer known in the art. The semiconductor substrate may be coated with a photoresist layer (e.g. an eUV photoresist layer) sensitive to eUV light. The wafer stage 150 is movable to allow various regions of the semiconductor substrate to be stepped and scanned.

Figure 2A:
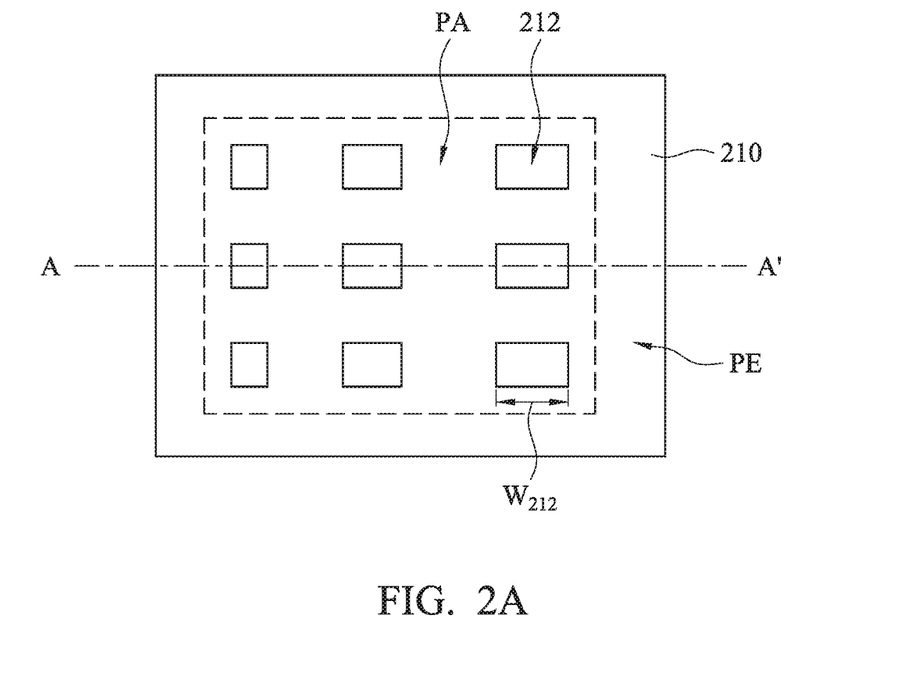
FIG. 2A is a schematic top-view of a photomask in accordance with some embodiments of the present disclosure.

FIG. 2A is a schematic top-view of a photomask 200 in accordance with some embodiments of the present disclosure. The photomask 200 may be the photomask 130 used in the lithography device 100 or another suitable lithography device. The photomask 200 includes a patterned photomask plate 210 which has a pattern region PA and a peripheral region PE surrounding the pattern region PA. In some embodiments, the patterned photomask plate 210 has a height H210 (shown in FIG. 2B) of about 2 nm to about 500 nm. In certain embodiments, the height H210 (shown in FIG. 2B) of the patterned photomask plate 210 is about 100 nm. In some embodiment, the patterned photomask plate 210 has a rectangular shape with sides of about 5 inches to about 9 inches in length. The patterned photomask plate 210 has a lattice form in its pattern region PA, i.e., openings 212 of patterned photomask plate 210 are arranged in a matrix form. In some embodiments, another arrangement of the openings 212 to the patterned photomask plate 210 may be deployed in the pattern region PA of the patterned photomask plate 210 depending on fabrication requirements. The width $W_{212}$ of each of the openings 212 may range from about 2 nm to about 50 nm, but is not limited thereto. In addition, the openings 212 may have different widths $W_{212}$.

In some embodiments, the patterned photomask plate 210 is a patterned substrate including a material, such as silica glass, titania doped silica glass, combinations thereof, and/or another suitable material known in the art. In such case, a blasted layer (not shown) is disposed on the upper surface of the patterned photomask plate 210. The blasted layer (not shown) may be disposed through an abrasive blasting process, a sand blasting process, a spray blasting process, and/or another suitable process, and may extend conforming to sidewalls of the openings 212.

In other embodiments, the patterned photomask plate 210 is a light absorber layer utilized to absorb light in a particular wavelength range, such as an ultraviolet light wavelength range, a DUV light wavelength range, an eUV light wavelength range and an X-ray wavelength range, depending on lithography applications. In such case, the patterned photomask plate 210 may be formed from a low thermal expansion coefficient (e.g. less than $9 \times 10^{-6}$ $K^{-1}$) and/or high melting point (e.g. higher than 1100° C.) material, such as quartz, silicon carbide, invar, tantalum boron nitride (TaBN), sitall, combinations thereof, and/or another suitable material.

Figure 2B:
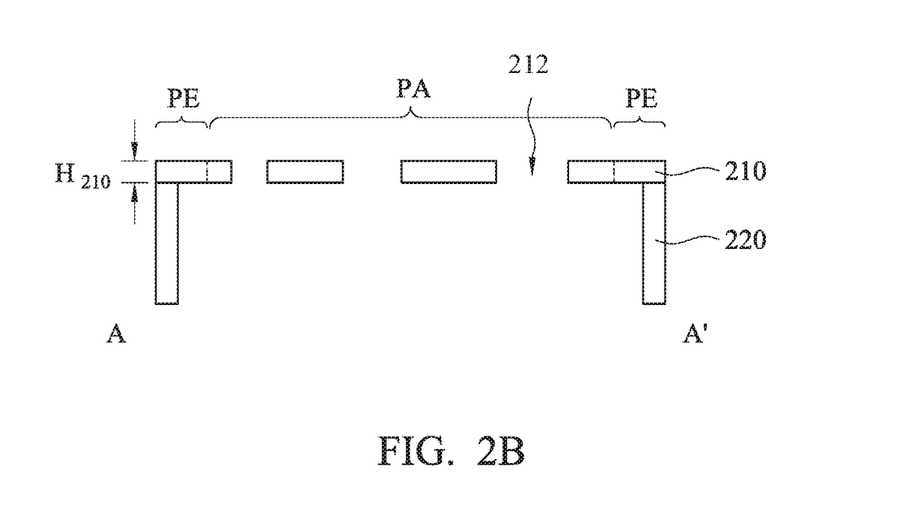
FIG. 2B is a cross-sectional view of the photomask of FIG. 2A.

FIG. 2B is a schematic cross-sectional view of the photomask 200 along the line A-A' shown in FIG. 2A. As shown in FIG. 2B, the photomask 200 also includes a supporting member 220 abutting the lower surface of the patterned photomask plate 210 in the peripheral region PE. The supporting member 220 may including a material, such as silica glass, titania doped silica glass, combinations thereof, and/or another suitable material known in the art. In such case, a blasted layer (not shown) is disposed on the upper surface of the patterned photomask plate 210. In certain embodiments, the supporting member 220 has a material the same as that of the patterned photomask plate 210, and the patterned photomask plate 210 and the supporting member 220 may be an integrally formed structure.

In certain embodiments, a coherent light pellicle (not shown) may be installed at the upper surface and/or the lower surface of the photomask 200, in order to provide protection against particle contemplation for the photomask 200. The coherent light pellicle may have a material having a low thermal expansion coefficient and a high melting point.

Figure 3A:
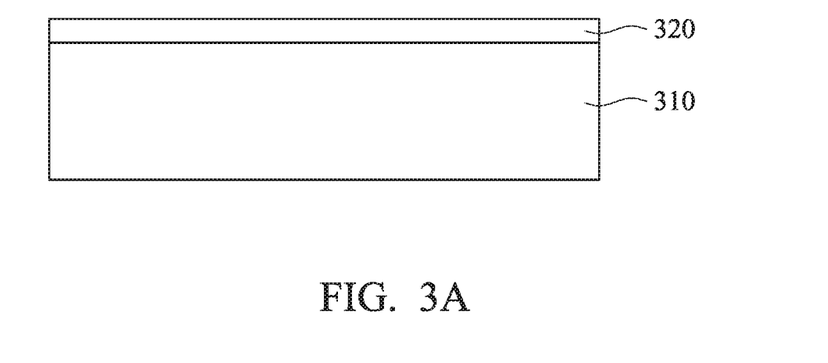
FIG. 3A to FIG. 3K are schematic cross-sectional views of intermediate stages in the formation of a photomask in accordance with some embodiments of the present disclosure.

FIG. 3A to FIG. 3K are schematic cross-sectional views of intermediate stages in the formation of a photomask in accordance with some embodiments of the present disclosure. As shown in FIG. 3A, a substrate 310 is provided, and a hard mask layer 320 is formed on the substrate 310. The substrate 310 may be formed from a material, such as silica glass, titania doped silica glass, combinations thereof, and/or another suitable material known in the art. The substrate 310 is provided having a pattern region PA and a peripheral region PE surrounding the pattern region PA. In some embodiment, the substrate 310 is provided having a rectangular shape with sides of about 5 inches to about 9 inches in length. The hard mask layer 320 may be formed from one or more dielectric materials, such as silicon carbon nitride, silicon nitride, silicon oxynitride, nitride, titanium nitride, and/or the like. The hard mask layer 320 may be formed using one or more processes, such as a chemical vapor deposition (CVD) process, a low pressure CVD (LPCVD) process, a plasma enhanced CVD (PECVD) process, a physical vapor deposition (PVD) process, an atomic layer deposition (ALD) process, a spin-on coating process, a sputtering process, a thermal oxidation process, combinations thereof, and/or the like.

Figure 3B:
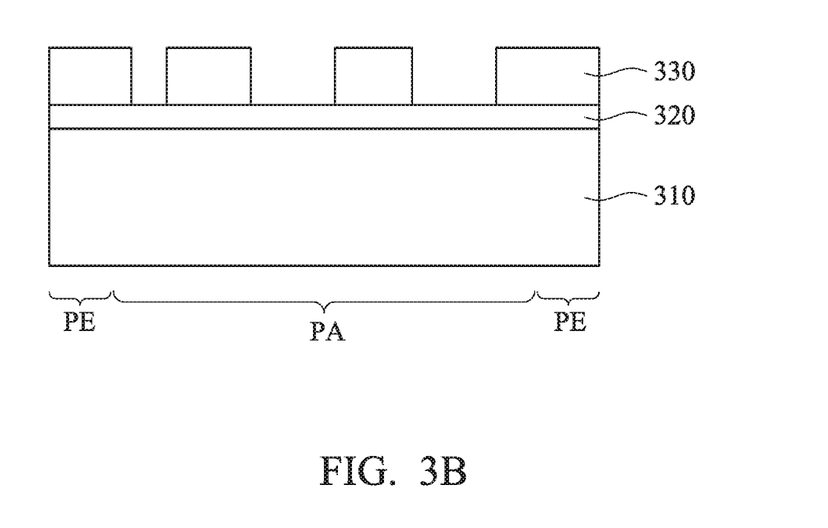

In FIG. 3B, a first patterned photoresist 330 is formed on the hard mask layer 320 to define etching portions of the hard mask layer 320 and the substrate 310. The first patterned photoresist 330 is formed including a photoresist material that is sensitive to light, X-ray, an electron beam, an ion beam, or other suitable radiation source, depending on the type of patterning operation for the first patterned photoresist 330. In some embodiments, the first patterned photoresist 330 is formed by a spin-on coating process and then a maskless lithography process, such as e-beam direct writing.

Figure 3C:
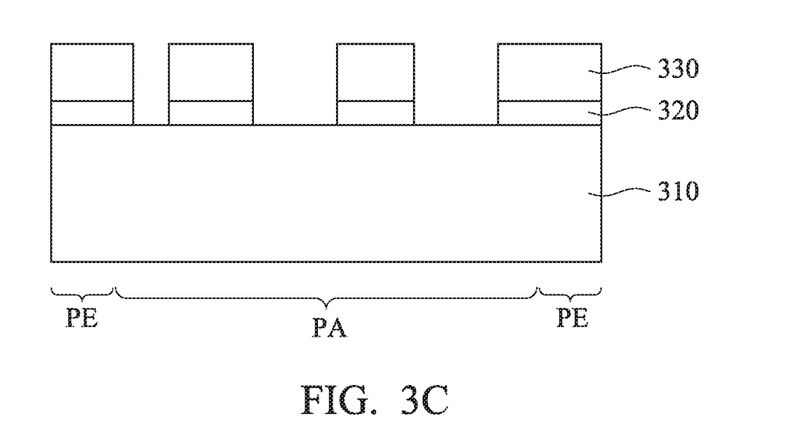

In FIG. 3C, portions of the hard mask layer 320 uncovered by the first patterned photoresist 330 are etched by a first etching operation to form openings in the pattern region PA which expose the substrate 310. The first etching operation may include reactive ion etching process, a plasma etching process, a dry etching process, a wet etching process, combinations thereof, or another suitable etching process.

Figure 3D:
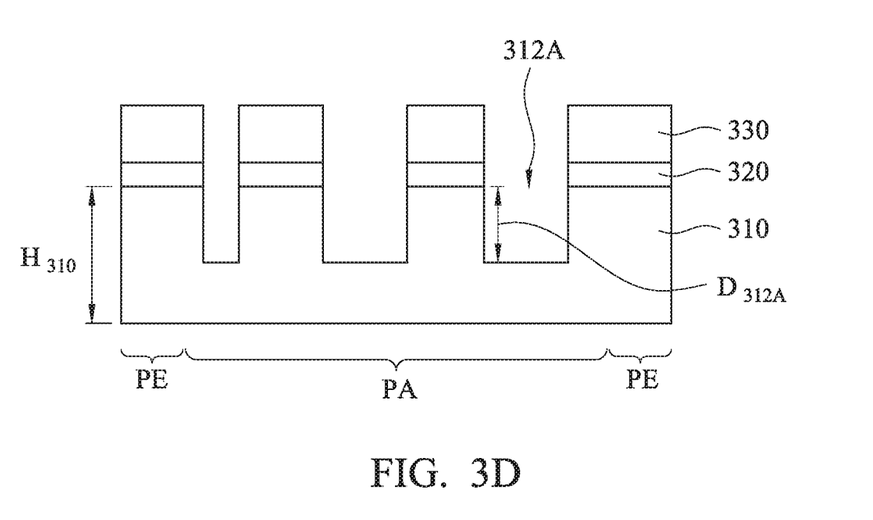

In FIG. 3D, portions of the substrate 310 corresponding to the openings of the hard mask layer 320 are etched by a second etching operation to form first recesses 312A in the substrate 310. The substrate 310 is etched by a dry etching operation, such as plasma etching, physical dry etching, gas etching, chemical dry etching, reactive ion etching, physical-chemical etching, combinations thereof, and the like. The depth of the first recesses 312A is controlled by the second etching operation depending on the design requirements and conditions, such as the material of the substrate 310 and the width of the openings of the hard mask layer 320. In some embodiments, a depth $D_{312A}$ of the first recesses 312A is about 20% to 80% of a height $H_{310}$ of the substrate 310.

Figure 3E:
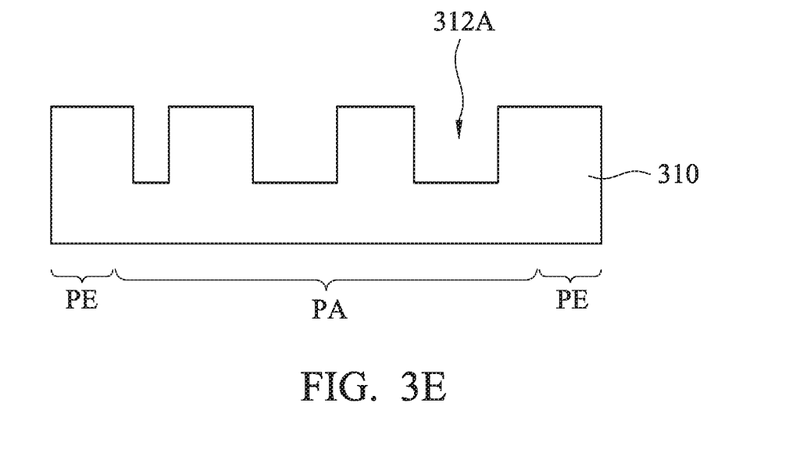

In FIG. 3E, the first patterned photoresist 330 and the hard mask layer 320 are removed after the formation of the first recesses 312A of the substrate 310. The first patterned photoresist 330 may be removed by a wet stripping process and/or plasma ashing process, such as an oxygen plasma ashing and another suitable process. The hard mask layer 340 may be removed by a wet etching process, a dry etching process, a plasma ashing processes, a chemical mechanical polishing (CMP) process, or another suitable process.

In some embodiments, the first patterned photoresist 330 and the hard mask layer 320 are removed in different steps; the first patterned photoresist 330 is removed before the dry etching operation to the substrate 310, and then the hard mask layer 320 is removed after the dry etching operation to the substrate 310.

Figure 3F:
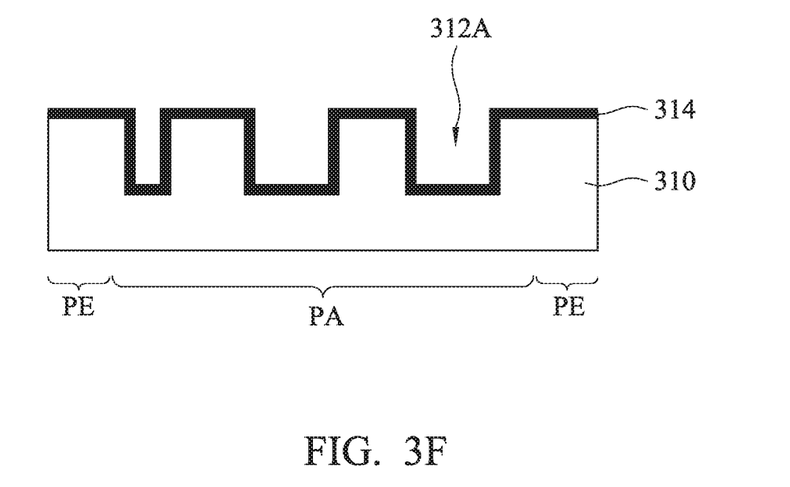

In FIG. 3F, a blasting operation is performed on the upper surface of the substrate 310 (i.e. the etched surface of the substrate 310 of the dry etching process to the substrate 310) and sidewalls of the first recesses 312A, so as to form a blasted layer 314. The blasting operation may include an abrasive blasting process, a sand blasting process, a spray blasting process, and/or another suitable process. In some embodiments, the blasting operation is performed by a spray blasting process with fluorine nitride ($NF_3$) plasma. In certain embodiments, the blasting operation is only performed on the upper surface of the substrate 310 rather the sidewalls of the first recesses 312A.

Figure 3G:
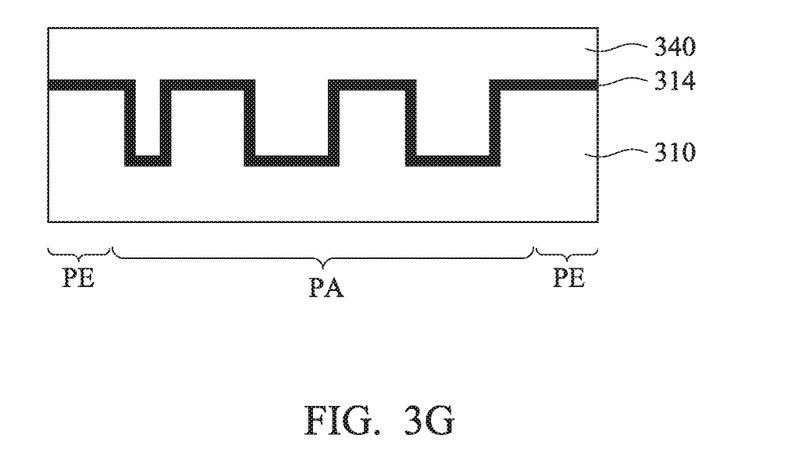

In FIG. 3G, a bottom anti-reflective coating (BARC) layer 340 is formed filling the first recesses 312A and over the upper surface of the substrate 310. The BARC layer 340 may be formed from an inorganic material, such as silicon nitride, silicon oxynitride, titanium nitride, and the like. The BARC layer 340 may be formed by a CVD process, a PVD process, an ALD process, a sputtering process, a spin-on coating process, or another suitable process. Alternatively, in some embodiments, the BARC layer is an organic anti-reflective layer formed by a spin-on coating process 340.

Figure 3H:
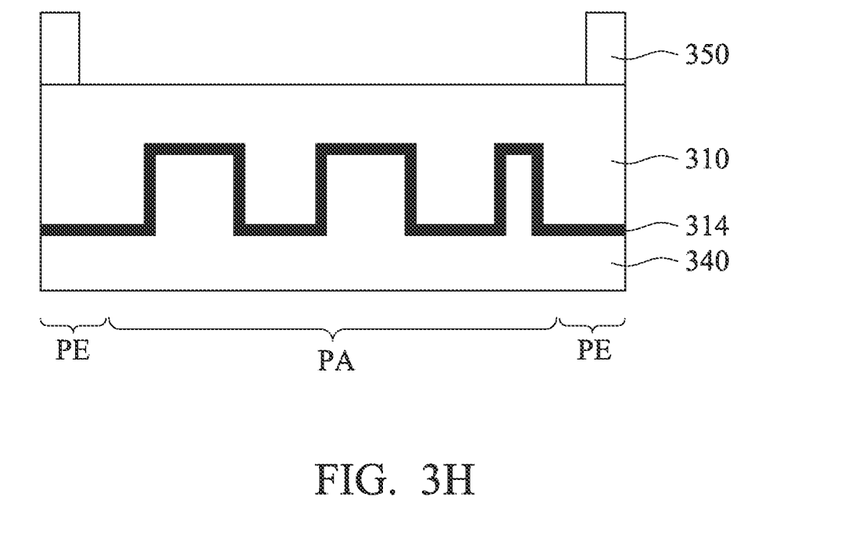

In FIG. 3H, a second patterned photoresist 350 is formed on the lower surface of the substrate 310 (opposite to the upper surface of the substrate 310) and in the peripheral region PE of the substrate 310. The second patterned photoresist 350 is formed including a photoresist material that is sensitive to light, X-ray, an electron beam, an ion beam, or other suitable radiation source, depending on the type of patterning operation for the second patterned photoresist 350. In some embodiments, the second patterned photoresist 350 is formed by a spin-on coating process and then a lithography process known in the art.

Figure 3I:
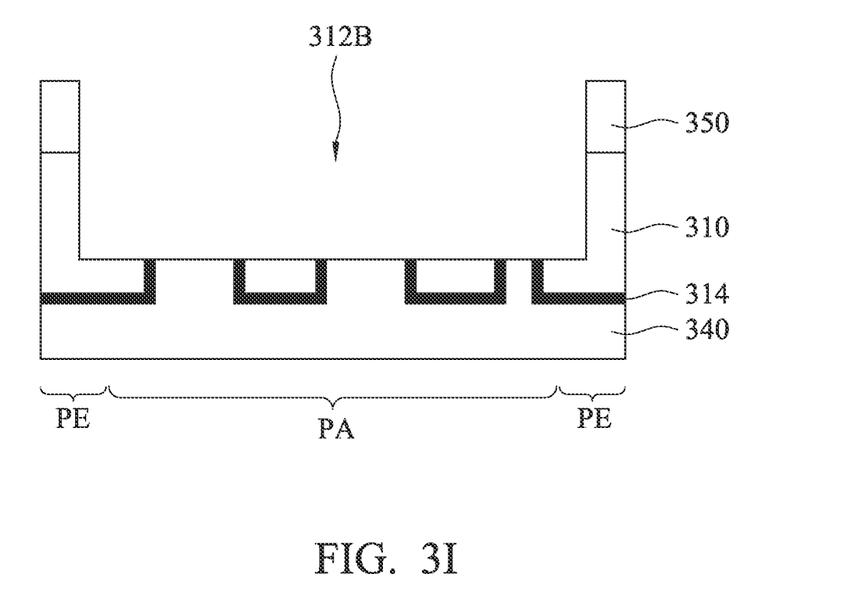

In FIG. 3I, a portion of the substrate 310 uncovered by the second patterned photoresist 350 is etched by a third etching operation to form a second recess 312B. The third etching operation may include reactive ion etching process, a plasma etching process, a dry etching process, a wet etching process, combinations thereof, or another suitable etching process. The third etching operation continues to etch the blasted layer 314 until the BARC layer 340 is exposed. The depth of the second recess 312B is controlled by the third etching operation depending on the design requirements and conditions, such as the material of the substrate 310 and the width of an opening of the second photoresist layer 350 which exposes the lower surface of the substrate 310. In certain embodiments, the third etching operation may continue to etch the BARC layer 340 until the depth $D_{312B}$ of the second recess 312 reaches a predetermined value. The summation of the depth $D_{312B}$ of the second recess 312B and the depth $D_{312A}$ of each of the first recesses 312A (shown in FIG. 3D) is greater the height $H_{310}$ of the substrate 310 (shown in FIG. 3D), so as to form openings in the final structure of the photomask (will be discussed in FIG. 3K).

Figure 3J:
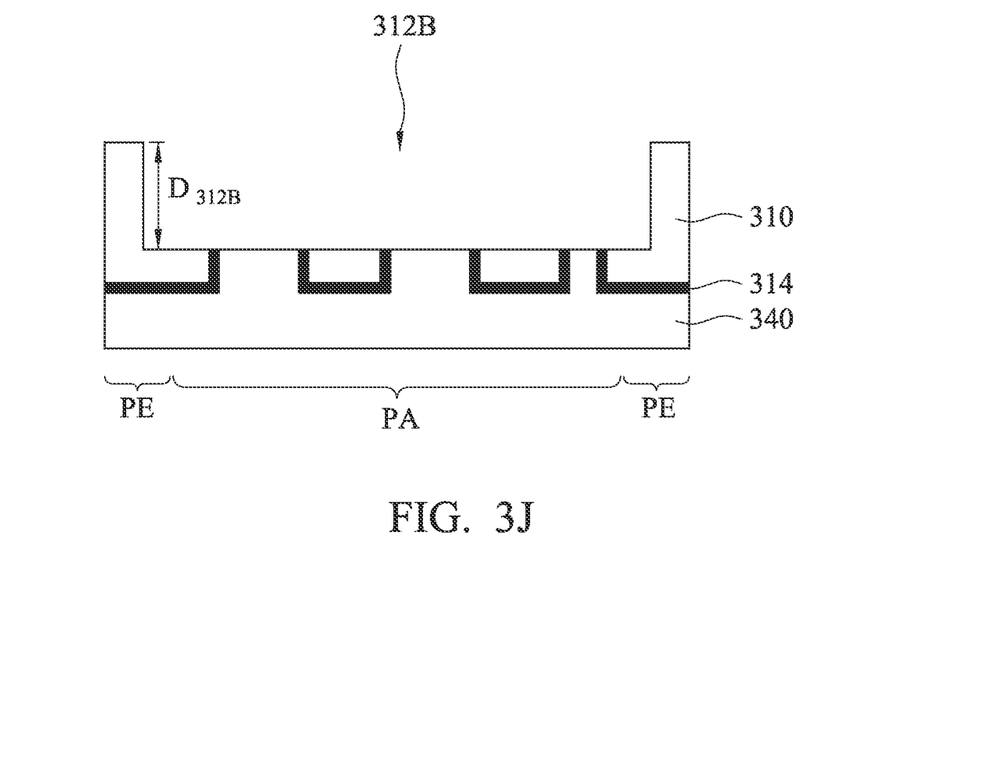

In FIG. 3J, the second patterned photoresist 350 is removed after the formation of the second recess 312B of the substrate 310. The second patterned photoresist 350 may be removed by a wet stripping process and/or plasma ashing process, such as an oxygen plasma ashing process and another suitable process.

Figure 3K:
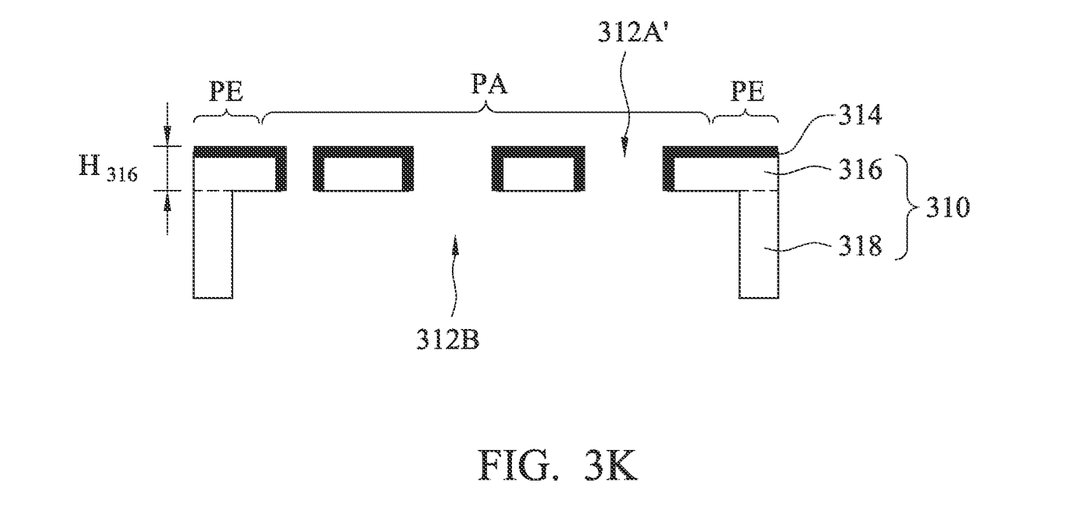

In FIG. 3K, the BARC layer 340 is removed from the substrate 310, and therefore openings 312A' are formed in the substrate 310. The BARC layer 340 may be removed by a plasma etching process, a de-scum process or another suitable process. As shown in FIG. 3K, the substrate 310 is separated into a patterned photomask plate 316 (including the blasted layer 314) and a supporting member 318. A height H316 of the patterned photomask plate 316 is the height $H_{310}$ of the substrate 310 (shown in FIG. 3D) subtracted by the depth $D_{312B}$ of the second recess 312B (shown in FIG. 3D). In some embodiments, the patterned photomask plate 316 is formed having the height H316 of about 2 nm to about 500 nm. In some embodiments, the patterned photomask plate 316 is formed having the height H316 of about 100 nm.

Figure 4A:
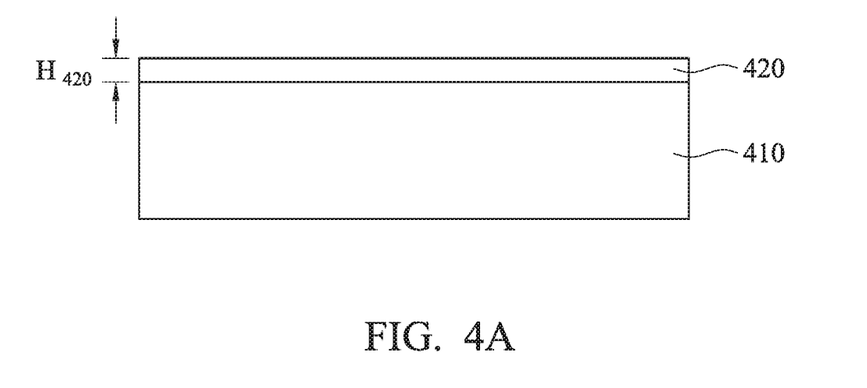
FIG. 4A to FIG. 4I are schematic cross-sectional views of intermediate stages in the formation of a photomask in accordance with some embodiments of the present disclosure.

FIG. 4A to FIG. 4I are schematic cross-sectional views of intermediate stages in the formation of a photomask in accordance with some embodiments of the present disclosure. As shown in FIG. 4A, a substrate 410 is provided, and a light absorber layer 420 is formed on the upper surface of the substrate 410. The substrate 410 may be formed from a material, such as silica glass, titania doped silica glass, combinations thereof, and/or another suitable material known in the art. The substrate 410 is provided having a pattern region PA and a peripheral region PE surrounding the pattern region PA. In some embodiment, the substrate 410 is provided having a rectangular shape with sides of about 5 inches to about 9 inches in length. The light absorber layer 420 is utilized to absorb light in a particular wavelength range, such as an ultraviolet light wavelength range, a DUV light wavelength range, an eUV light wavelength range and an X-ray wavelength range, depending on lithography applications. The light absorber layer 420 may be formed from a low thermal expansion coefficient (e.g. less than $9\times10^{-6}$ $K^{-1}$) and/or high melting point (e.g. higher than 1100° C.) material, such as quartz, silicon carbide, invar, tantalum boron nitride (TaBN), sitall, combinations thereof, and/or another suitable material. The light absorber layer 420 may be formed using one or more processes, such as a CVD process, an LPCVD process, a PECVD process, a PVD process, an ALD process, a spin-on coating process, a sputtering process, a thermal oxidation process, combinations thereof, and/or the like. In some embodiments, the light absorber layer 420 is formed having a height $H_{420}$ of about 2 nm to about 500 nm. In some embodiments, the height $H_{420}$ of the light absorber layer 420 is of about 100 nm. In certain embodiments, the light absorber layer 420 is a multi-layer structure including multiple light absorber layers or the same or different materials. In the following the pattern region PA and the peripheral region PE are also referred to as the pattern region PA and the peripheral region PE of the light absorber layer 420.

Figure 4B:
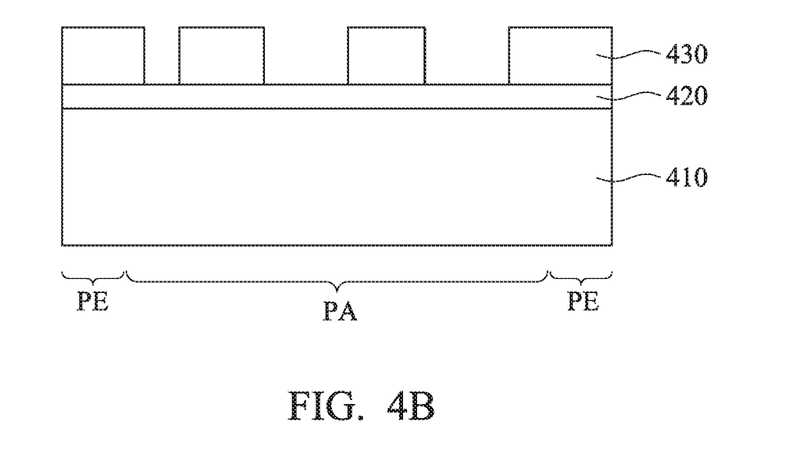

In FIG. 4B, a first patterned photoresist 430 is formed on the light absorber layer 420 to define etching portions of the light absorber layer 420 and the substrate 410. The first patterned photoresist 430 is formed including a photoresist material that is sensitive to light, X-ray, an electron beam, an ion beam, or other suitable radiation source, depending on the type of patterning operation for the first patterned photoresist 430. In some embodiments, the first patterned photoresist 430 is formed by a spin-on coating process and then a maskless lithography process, such as e-beam direct writing.

Figure 4C:
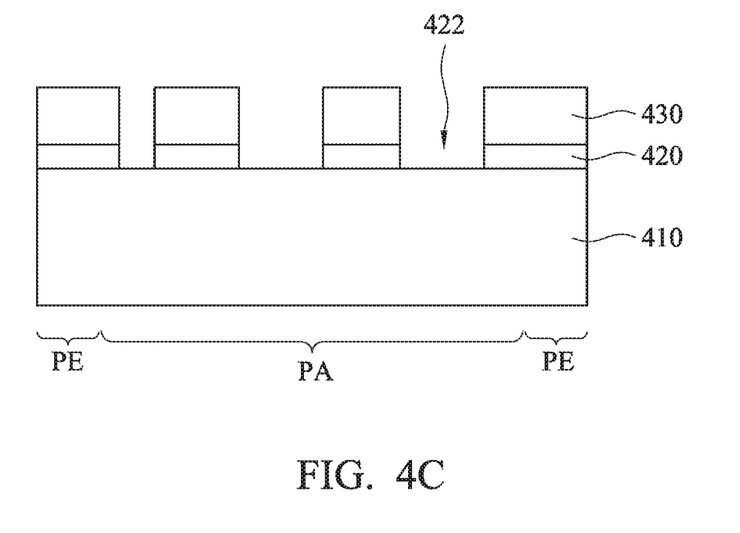

In FIG. 4C, portions of the light absorber layer 420 uncovered by the first patterned photoresist 430 are etched by a first etching operation to form openings 422 in the pattern region PA which expose the substrate 410. The first etching operation may include reactive ion etching process, a plasma etching process, a dry etching process, a wet etching process, or another suitable etching process.

Figure 4D:
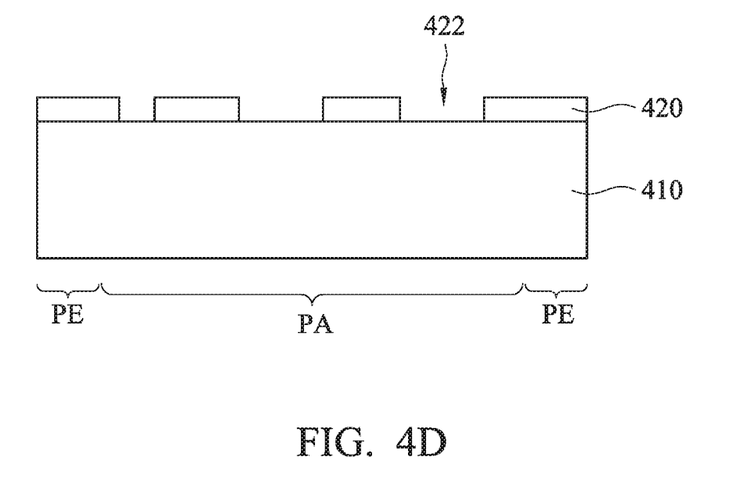

In FIG. 4D, the first patterned photoresist 430 is removed after the formation of the openings 422 of the light absorber layer 420. The first patterned photoresist 430 may be removed by a wet stripping process and/or plasma ashing process, such as an oxygen plasma ashing and another suitable process.

Figure 4E:
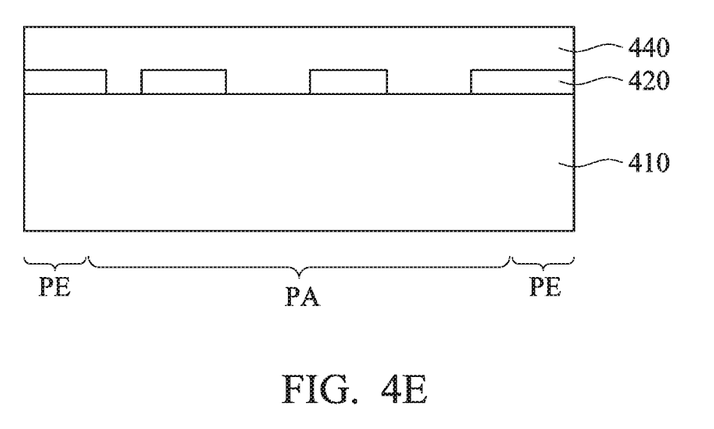

In FIG. 4E, a BARC layer 440 is formed filling the openings 422 and over the upper surface of the substrate 410. The BARC layer 440 may be formed from an inorganic material, such as silicon nitride, silicon oxynitride, titanium nitride, and the like. The BARC layer 440 may be formed by a CVD process, a PVD process, an ALD process, a sputtering process, a spin-on coating process, or another suitable process. Alternatively, in some embodiments, the BARC layer 440 is an organic anti-reflective layer formed by a spin-on coating process.

Figure 4F:
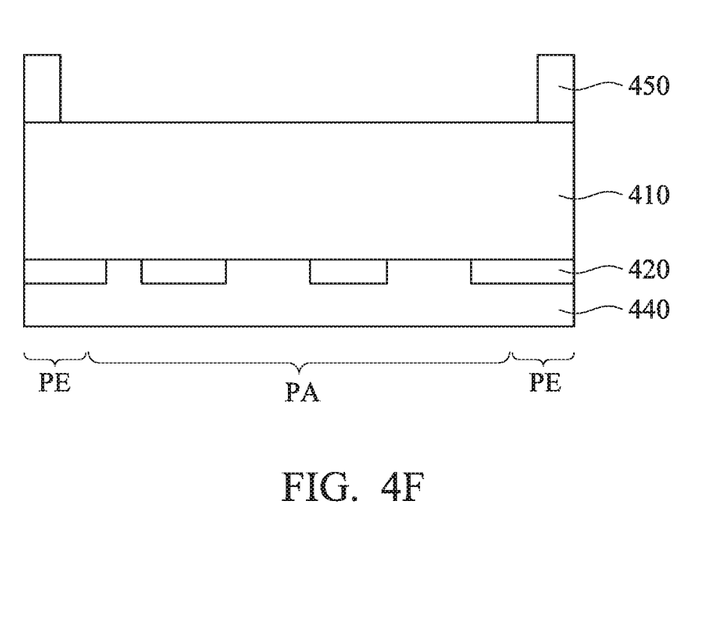

In FIG. 4F, a second patterned photoresist 450 is formed on the lower surface of the substrate 410 (opposite to the upper surface of the substrate 410) and in the peripheral region PE of the substrate 410. The second patterned photoresist 450 is formed including a photoresist material that is sensitive to light, X-ray, an electron beam, an ion beam, or other suitable radiation source, depending on the type of patterning operation for the first patterned photoresist 430. In some embodiments, the second patterned photoresist 450 is formed by a spin-on coating process and then a lithography process known in the art.

Figure 4G:
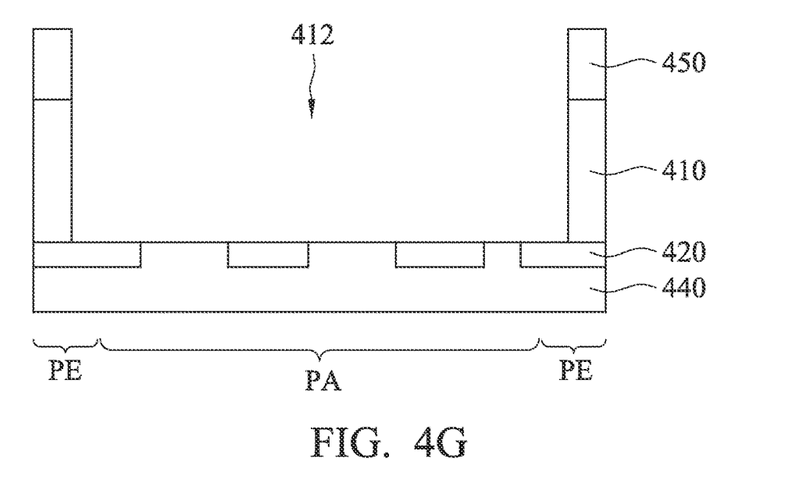

In FIG. 4G, a portion of the substrate 410 uncovered by the second patterned photoresist 450 is etched by a third etching operation, thereby forming a recess 412 in the substrate 410. The third etching operation may include reactive ion etching process, a plasma etching process, a dry etching process, a wet etching process, combinations thereof, or another suitable etching process.

Figure 4H:
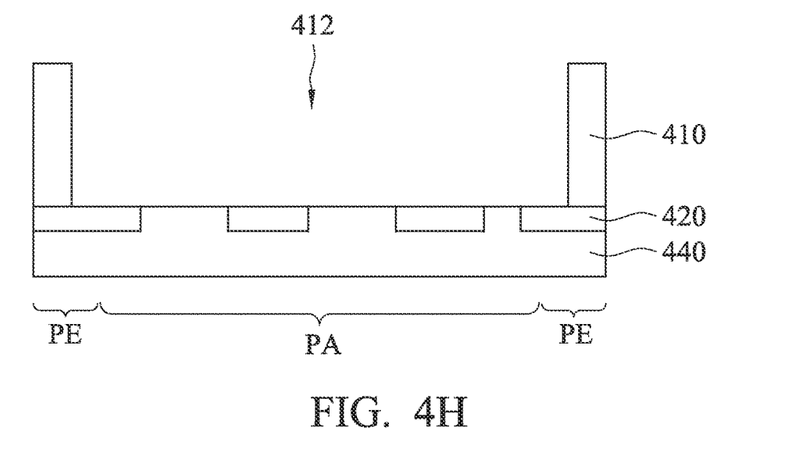

In FIG. 4H, the second patterned photoresist 450 is removed after the formation of the recess 412 of the substrate 410. The second patterned photoresist 350 may be removed by a wet stripping process and/or plasma ashing process, such as an oxygen plasma ashing process and another suitable process.

Figure 4I:
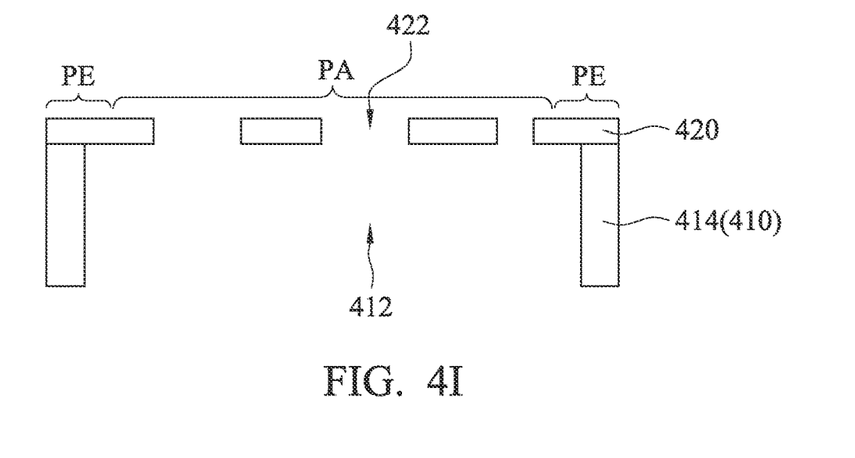

In FIG. 4I, the BARC layer 440 is removed from the light absorber layer 420, and therefore the openings 422 are exposed. The BARC layer 440 may be removed by a plasma etching process, a de-scum process or another suitable process. The remained substrate 410 is represented as a supporting member 414.

In certain embodiments, after the photomask (e.g. shown in FIG. 3K or FIG. 4I) is formed, a coherent light pellicle may be installed at the upper surface and/or the lower surface of the photomask, in order to provide protection against particle contemplation for the photomask. The coherent light pellicle may be formed from a material having a low thermal expansion coefficient and a high melting point.

With the photomask fabricated through the fabricating operations illustrated in FIG. 3A to FIG. 3K or FIG. 4A to FIG. 4I for a lithography device, such as an eUV lithographic device, the optical transmission loss can be eliminated. In other words, with the photomask fabricated in accordance with the present disclosure, the optical efficiency in a lithographic operation can be considerably improved. In addition, since an extra reflective layer is not required, the photomask has a simplified structure, and therefore has at least the advantages of lower fabricating cost, lower particle issue and easier for inspection. Moreover, for the embodiments exemplified in the present disclosure, the components (i.e. the patterned photomask plate/the light absorber layer and the supporting member) of the photomask have low thermal expansion coefficient and high melting point, and therefore the photomask can be utilized of an eUV lithography operation under a high power environment without any photomask peeling issue.

In accordance with some embodiments, a photomask includes a patterned photomask plate and a supporting member. The patterned photomask plate has a pattern region and a peripheral region surrounding the pattern region. The patterned photomask plate includes a plurality of openings in the pattern region. The supporting member directly abuts the patterned photomask plate and is in a peripheral region of the patterned photomask plate. The supporting member is formed from a different material than the patterned photomask plate.

In accordance with some embodiments, a photomask includes a patterned photomask plate and a supporting member. The patterned photomask plate has a pattern region formed with a plurality of openings and a peripheral region surrounding the pattern region. The supporting member is in a peripheral region. The patterned photomask plate and the supporting member are an integrally formed structure.

In accordance with some embodiments, a photomask includes a patterned photomask plate and a supporting member. The patterned photomask plate has a pattern region formed with a plurality of openings and a peripheral region surrounding the pattern region. The patterned photomask plate is formed from quartz. The supporting member abuts the patterned photomask plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask, comprising:
a patterned photomask plate having a pattern region and a peripheral region surrounding the pattern region, wherein the patterned photomask plate comprises a plurality of openings in the pattern region, and the patterned photomask plate comprises invar and has a thickness in a range from about 2 nm to about 500 nm; and
a supporting member directly abutting the patterned photomask plate and in the peripheral region of the patterned photomask plate, wherein the supporting member is formed from a different material than the patterned photomask plate.

2. The photomask of claim 1, wherein the patterned photomask plate and the supporting member have a substantially U-shaped cross-section.

3. The photomask of claim 1, wherein the patterned photomask plate has a melting point higher than about 1100° C.

4. The photomask of claim 1, wherein the patterned photomask plate has a thermal expansion coefficient less than about $9 \times 100^{-6}$ $K^{-1}$.

5. The photomask of claim 1, wherein the patterned photomask plate includes a plurality of light absorber layers.

6. The photomask of claim 1, wherein the supporting member comprises titania doped silica glass.

7. The photomask of claim 1, wherein a bottom surface of the patterned photomask plate has a first portion in contact with the supporting member and a second portion exposed.

8. A photomask, comprising:
a patterned photomask plate having a pattern region formed with a plurality of openings and a peripheral region surrounding the pattern region, wherein at least a portion of a top surface of the patterned photomask plate is free of direct contact with any absorber layers; and
a supporting member in the peripheral region, wherein the patterned photomask plate and the supporting member are defined by a single piece of material that is continuous throughout and that comprises silica glass.

9. A photomask, comprising:
a patterned photomask plate having a pattern region formed with a plurality of openings and a peripheral region surrounding the pattern region, wherein sidewalls of the openings are first blasted surfaces, and at least a portion of a top surface of the patterned photomask plate is free of direct contact with any absorber layers; and
a supporting member extending downwards from a bottom surface of the peripheral region of the patterned photomask plate, wherein the patterned photomask plate and the supporting member are defined by a single piece of material that is continuous throughout and that comprises silica glass.

10. The photomask of claim 9, wherein each of the openings has a width from about 2 nm to about 50 nm.

11. The photomask of claim 9, wherein the openings in the patterned photomask plate are arranged in rows and columns and the openings in the same column have substantially the same width.

12. The photomask of claim 9, wherein the openings in the patterned photomask plate are arranged in rows and columns and the openings of the patterned photomask plate in the same row have different widths.

13. The photomask of claim 9, wherein the openings are arranged along a length direction of the patterned photomask plate and have widths that increase from a first side of the patterned photomask plate to a second side of the patterned photomask plate.

14. The photomask of claim 9, wherein each of the first blasted surfaces extends from a top end to a bottom end of one of the sidewalls of the openings.

15. The photomask of claim 9, wherein an entire top surface of the pattern region of the patterned photomask plate is a second blasted surface.

16. The photomask of claim 15, wherein the second blasted surface is non-continuous with gaps corresponding to the openings and with an edge adjacent to each of the openings, and each of the first blasted surfaces extends downwards from a corresponding one of the edges of the second blasted surface to a bottom end of one of the sidewalls of the openings.

17. The photomask of claim 9, wherein a bottom end of at least one of the first blasted surfaces is substantially aligned horizontally with the bottom surface of the peripheral region of the patterned photomask plate.

18. The photomask of claim 9, wherein an entirety of a top surface of the peripheral region of the patterned photomask plate is a second blasted surface.

19. The photomask of claim 18, wherein the second blasted surface is substantially perpendicular to the first blasted surfaces.

20. The photomask of claim 9, wherein the patterned photomask plate has a thickness in a range from about 2 nm to about 500 nm.

* * * * *